United States Patent
Shen et al.

(10) Patent No.: US 8,101,525 B2
(45) Date of Patent: Jan. 24, 2012

(54) METHOD FOR FABRICATING A SEMICONDUCTOR DEVICE HAVING A LANTHANUM-FAMILY-BASED OXIDE LAYER

(75) Inventors: Meihua Shen, Fremont, CA (US); Noel Sun, Sunnyvale, CA (US); Nicolas Gani, San Jose, CA (US); Han-Hsiang Chen, Lingya District (TW); Eric Pei, Tainan County (TW); Weimin Zeng, San Jose, CA (US); Thorsten B. Lill, Santa Clara, CA (US); Uday Mitra, Cupertino, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 393 days.

(21) Appl. No.: 12/371,085

(22) Filed: Feb. 13, 2009

(65) Prior Publication Data

US 2010/0210112 A1 Aug. 19, 2010

(51) Int. Cl.
*H01L 21/302* (2006.01)
*H01L 21/461* (2006.01)

(52) U.S. Cl. ............ 438/710; 438/585; 257/E21.218

(58) Field of Classification Search .......... 438/710, 438/585; 257/E21.218
See application file for complete search history.

(56) References Cited

U.S. PATENT DOCUMENTS

| | | | | |
|---|---|---|---|---|
| 5,149,684 A * | 9/1992 | Woolf et al. | ............ | 505/500 |
| 6,235,693 B1 * | 5/2001 | Cheng et al. | ............ | 510/175 |
| 6,974,764 B2 * | 12/2005 | Brask et al. | ............ | 438/585 |
| 7,521,369 B2 * | 4/2009 | Shamiryan et al. | ............ | 438/710 |
| 2005/0101113 A1 | 5/2005 | Brask et al. | | |
| 2006/0071275 A1 | 4/2006 | Brask et al. | | |
| 2009/0032910 A1 | 2/2009 | Ahn et al. | | |

OTHER PUBLICATIONS

International Search Report and Written Opinion for International Patent Application No. PCT/US2010/023386, mailed Sep. 30, 2010, 8 pgs.
International Preliminary Report on Patentability from PCT/US2010/023386 mailed Aug. 25, 2011, 5 pgs.

* cited by examiner

*Primary Examiner* — Stephen W Smoot
*Assistant Examiner* — Vicki B Booker
(74) *Attorney, Agent, or Firm* — Blakely Sokoloff Taylor & Zafman LLP

(57) ABSTRACT

Methods for fabricating a semiconductor device having a lanthanum-family-based oxide layer are described. A gate stack having a lanthanum-family-based oxide layer is provided above a substrate. At least a portion of the lanthanum-family-based oxide layer is modified to form a lanthanum-family-based halide portion. The lanthanum-family-based halide portion is removed with a water vapor treatment.

21 Claims, 6 Drawing Sheets

METHOD FOR FABRICATING A SEMICONDUCTOR DEVICE HAVING A LANTHANUM-FAMILY-BASED OXIDE LAYER

BACKGROUND

1) Field

Embodiments of the invention are in the field of semiconductor devices and, in particular, methods for fabricating a semiconductor device having a lanthanum-family-based oxide layer.

2) Description of Related Art

For the past several decades, the scaling of features in integrated circuits has been the driving force behind an ever-growing semiconductor industry. Scaling to smaller and smaller features enables increased densities of functional units on the limited real estate of semiconductor chips. For example, shrinking transistor size allows for the incorporation of an increased number of logic and memory devices on a microprocessor, lending to the fabrication of products with increased complexity. Scaling has not been without consequence, however. As the dimensions of the fundamental building blocks of microelectronic circuitry are reduced and as the sheer number of fundamental building blocks fabricated in a given region is increased, the performance requirements of the materials used in these building blocks have become exceedingly demanding. One example is the change from poly-crystalline silicon to metal gate electrodes in complimentary metal-oxide-semiconductor (CMOS) transistors, starting at around the 45 nanometer or 32 nanometer technology nodes.

Metal gate electrodes for CMOS transistors can be fabricated in a replacement gate integration scheme. However, as constraints on dimensions increase, problems may arise with conventional approaches. For example, FIGS. 1A-1C illustrate cross-sectional views representing operations in a conventional replacement gate integration scheme.

Referring to FIG. 1A, a partially completed semiconductor device 100 is formed in and above a substrate 102. Source and drain regions 104 define a channel region 106 in substrate 102 and underneath a gate dielectric layer 108. A trench 110 is formed in a dielectric layer 112 and, in particular, in between a pair of dielectric spacers 114. A gate electrode for semiconductor device 100 may ultimately be formed in trench 110.

In a replacement gate integration scheme, the gate electrode is formed by depositing a metal layer over a partially completed semiconductor device to fill at least a portion of a trench 110. Referring to FIG. 1B, a gate electrode is formed by depositing a metal layer 116 over partially completed semiconductor device 100 to fill a portion of trench 110. However, metal layer 116 may be pinched-off at the top of trench 110 prior to completion of the filling of trench 110. Hence, a void 120 may undesirably be formed within trench 110, as depicted in FIG. 1B.

Referring to FIG. 1C, metal layer 116 has been planarized to form a planarized metal layer 118, exposing void 120 formed within trench 110. Void 120 may undesirably collect residue from processing steps, such as slurry residue from a chemical-mechanical polishing step used to planarize metal layer 116. The inclusion of such residue may interfere with subsequent process steps and, if retained in a completed semiconductor device, may impact the performance or function of the completed semiconductor device.

SUMMARY

Embodiment of the present invention include methods for fabricating a semiconductor device having a lanthanum-family-based oxide layer. In an embodiment, a gate stack having a lanthanum-family-based oxide layer is provided above a substrate. At least a portion of the lanthanum-family-based oxide layer is modified to form a lanthanum-family-based halide portion. The lanthanum-family-based halide portion is removed with a water vapor treatment.

In another embodiment, a patterned mask layer is provided above a gate stack, the gate stack including a metal gate layer above a lanthanum-family-based oxide work-function layer above a gate dielectric layer. The region of the metal gate layer not protected by the patterned mask layer is removed by etching. A first portion of the region of the lanthanum-family-based oxide layer not protected by the patterned mask layer is modified to form a first lanthanum-family-based halide portion. The first lanthanum-family-based halide portion is removed, in a dry environment, with a first water vapor treatment. A second portion of the region of the lanthanum-family-based oxide layer not protected by the patterned mask layer is modified to form a second lanthanum-family-based halide portion. The second lanthanum-family-based halide portion is removed, in a dry environment, with a second water vapor treatment. All remaining portions of the region of the lanthanum-family-based oxide layer not protected by the patterned mask layer are modified to form a third lanthanum-family-based halide portion. The third lanthanum-family-based halide portion is then removed, in a wet environment, with a water-based solution. In one embodiment, the removing of the portion of the metal gate layer, the modifying of the first portion of the lanthanum-family-based oxide layer, the removing of the first lanthanum-family-based halide portion, the modifying of the second portion of the lanthanum-family-based oxide layer, the removing of the second lanthanum-family-based halide portion, and the modifying all remaining portions of the lanthanum-family-based oxide layer are performed in a single-pass, without breaking vacuum, of the substrate in a single-wafer tool.

DETAILED DESCRIPTION

Figure 1A:
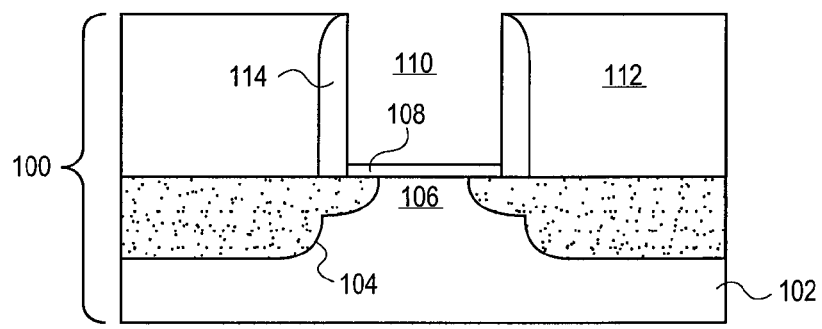
FIGS. 1A-1C illustrate cross-sectional views representing operations in a conventional replacement gate integration scheme.
Figure 1B:
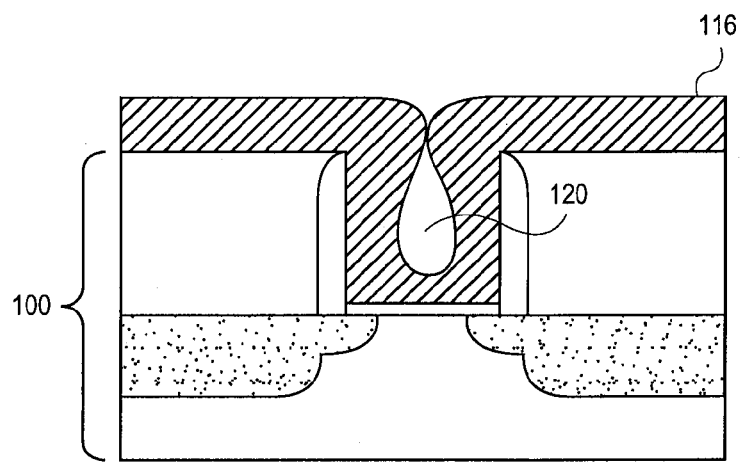
Figure 1C:
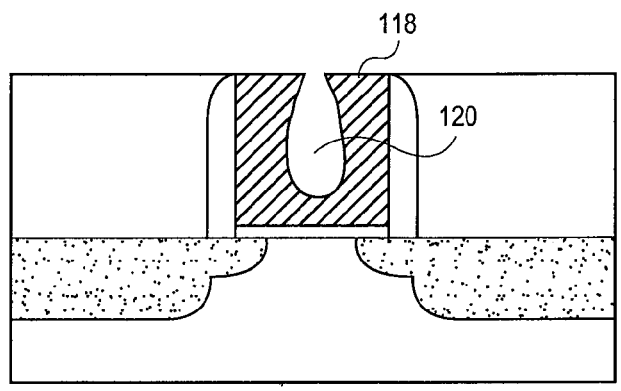

Methods for fabricating a semiconductor device having a lanthanum-family-based oxide layer are described. In the following description, numerous specific details are set forth, such as fabrication conditions and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Disclosed herein are methods for fabricating a semiconductor device having a lanthanum-family-based oxide layer. A gate stack having a lanthanum-family-based oxide layer may be provided above a substrate. In one embodiment, at least a portion of the lanthanum-family-based oxide layer is modified to form a lanthanum-family-based halide portion. The lanthanum-family-based halide portion may then be removed with a water vapor treatment. In a specific embodiment, the gate stack includes a patterned mask layer above a first region, but not above a second region, of the lanthanum-family-based oxide layer. The method further includes repeating the modifying and the removing until the second region of the lanthanum-family-based oxide layer is entirely removed. In a particular embodiment, modifying the portion of the lanthanum-family-based oxide layer includes treating the portion with a plasma formed from species selected from the group consisting of HCl, $Cl_2$, HBr, and $Br_2$.

The use of a subtractive metal gate integration scheme may overcome certain issues, such as fill issues, common to a replacement gate integration scheme. However, in accordance with an embodiment of the present invention, the materials used in a subtractive metal gate integration scheme have certain properties that make them difficult to pattern by conventional etching processes. For example, in one embodiment, a lanthanum-family-based oxide layer is included in a gate stack patterned by etching processes. Selective removal of the lanthanum-family-based oxide layer by conventional dry etching techniques may not be optimal based on the non-volatile nature of such oxides, e.g. many have a boiling point grater than 1000 degrees Celsius. Alternatively, a wet removal may be used because of the aqueous solubility of a lanthanum-family-based oxide layer, but accurate control of the removal process may undermine the integrity of the layer during a pattern transfer process. Instead, in accordance with an embodiment of the present invention, an integrated dry etch including water vapor is used to remove, or partially remove, a lanthanum-family-based oxide layer. Thus, in an embodiment, an otherwise aqueous-soluble lanthanum-family-based oxide layer is removed using water vapor in a dry environment. In one embodiment, a lanthanum-family-based oxide layer is first modified to a lanthanum-family-based halide portion prior to applying the integrated dry etch.

Figure 2:
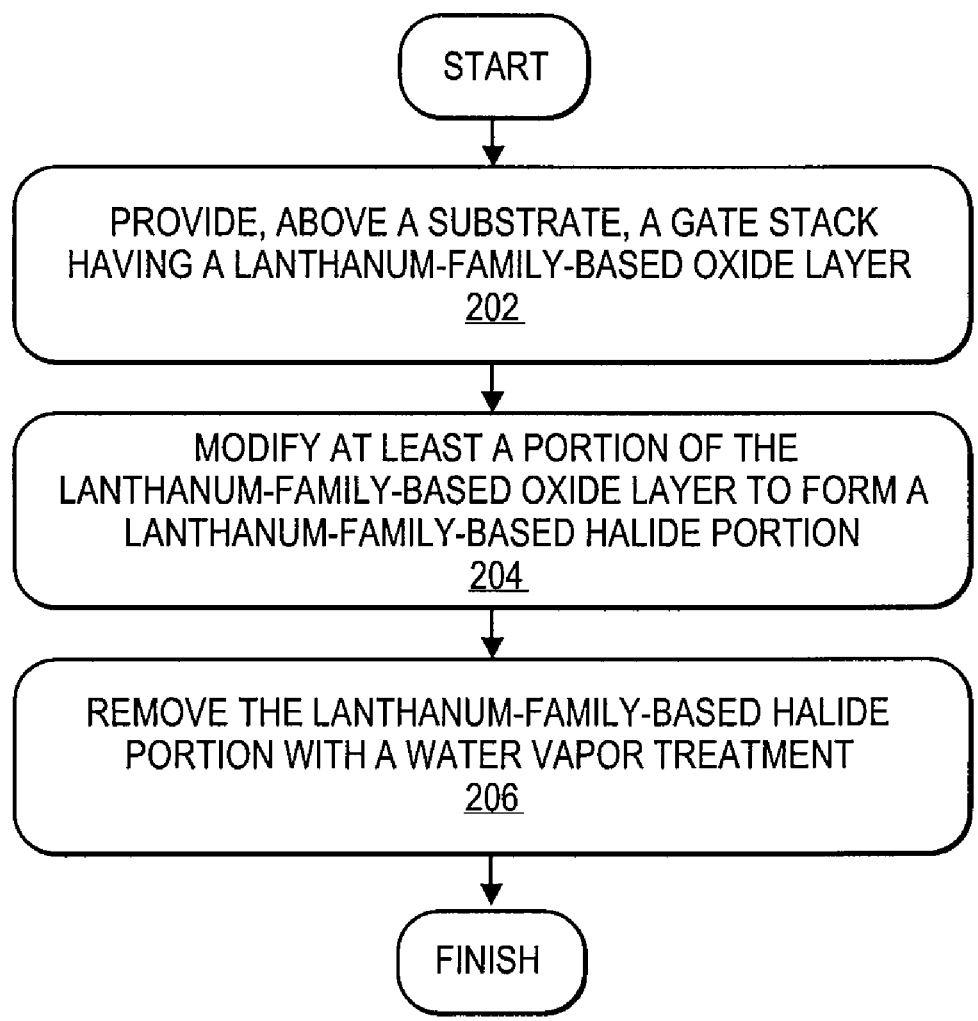
FIG. 2 depicts a Flowchart representing a series of operations in a method for fabricating a semiconductor device having a lanthanum-family-based oxide layer, in accordance with an embodiment of the present invention.

In an aspect of the present invention, methods for fabricating a semiconductor device having a lanthanum-family-based oxide layer include the use of a water vapor treatment. FIG. 2 depicts a Flowchart 200 representing a series of operations in a method for fabricating a semiconductor device having a lanthanum-family-based oxide layer, in accordance with an embodiment of the present invention.

Referring to operation 202 of Flowchart 200, a method for fabricating a semiconductor device includes providing, above a substrate, a gate stack having a lanthanum-family-based oxide layer. In accordance with an embodiment of the present invention, the gate stack includes a patterned mask layer above a first region, but not above a second region, of the lanthanum-family-based oxide layer. It may be desirable to remove the second region of the lanthanum-family-based oxide layer in order to provide a patterned gate stack. Thus, in one embodiment, an etch process, such as an etch process described below, is used to remove the second region of the lanthanum-family-based oxide layer. The lanthanum-family-based oxide layer may be any layer of an oxide of a lanthanum-family element, e.g., selected from the lanthanum series (elements 57 through 71) of the Periodic Table of the Elements. For example, in an embodiment, the lanthanum-family-based oxide layer is a layer such as, but not limited to, a lanthanum oxide layer ($La_2O_3$), a lanthanum sub-oxide layer ($LaO_x$, where x is less than 1.5), cerium$^{IV}$ oxide ($CeO_2$) or cerium$^{III}$ oxide ($Ce_2O_3$). In one embodiment, the lanthanum-family-based oxide layer is included as a work-function-setting or work-function-altering layer in a gate stack. For example, in a specific embodiment, the lanthanum-family-based oxide layer alters the work-function of a gate stack by at least 0.05 eV from the work-function of a gate stack that otherwise excludes the lanthanum-family-based oxide layer.

Referring to operation 204 of Flowchart 200, at least a portion of the lanthanum-family-based oxide layer is modified to form a lanthanum-family-based halide portion. In accordance with an embodiment of the present invention, the lanthanum-family-based oxide layer is modified to form the lanthanum-family-based halide portion includes treating the portion with a plasma formed from species such as, but not limited to, HCl, $Cl_2$, HBr, and $Br_2$. In an embodiment, forming the lanthanum-family-based halide portion includes forming a portion such as, but not limited to, a lanthanum-family-based fluoride portion, a lanthanum-family-based chloride portion, and lanthanum-family-based bromide portion. In one embodiment, forming the lanthanum-family-based halide portion includes forming a lanthanum halide portion. The lanthanum-family-based halide portion may be a saturated halide portion where the maximum number of halide species are bonded to the lanthanum-family-based element, e.g. $LaX_3$ or $CeX_4$ (X=halide, such as fluoride, chloride or bromide), or an unsaturated halide portion where less than the maximum number of halide species are bonded to the lanthanum-family-based element. In an alternative embodiment, modification operation 204 is omitted prior to performing the water vapor treatment described in association with operation 206, below.

Referring to operation 206 of Flowchart 200, the lanthanum-family-based halide portion is removed with a water vapor treatment. In accordance with an embodiment of the present invention, removing the lanthanum-family-based halide portion with the water vapor treatment includes using a combination of water vapor and a vapor selected from the group consisting of $Cl_2$ or HCl vapor. In one embodiment, removing the lanthanum-family-based halide portion with the water vapor treatment includes using a combination of water vapor HCl gas. In a specific embodiment, the combination of water vapor HCl gas is used in a plasma environment. In another specific embodiment, the combination of water vapor HCl gas is used in a non-plasma environment and, subsequently, in a plasma environment. In yet another specific embodiment, the combination of water vapor HCl gas is used in a non-plasma environment and, subsequently, in a plasma environment and, subsequently, a purge gas is used in a plasma environment to remove any water stains. In accordance with another embodiment of the present invention, removing the lanthanum-family-based halide portion with the water vapor treatment includes using water vapor only.

In an embodiment, removing the lanthanum-family-based halide portion with the water vapor treatment includes placing the substrate in a chamber having aluminum walls and introducing water vapor into the chamber at a pressure approximately in the range of 100 mTorr-5 Torr while heating the substrate at a temperature approximately in the range of 80-300 degrees Celsius. In a specific embodiment, heating the substrate includes ramping, over the duration of the water vapor treatment, the temperature of the substrate from a temperature of approximately 80 degrees Celsius to a final temperature approximately in the range of 150-300 degrees Celsius.

The method can include additional treatment operations. For example, in accordance with an additional embodiment of the present invention, the modifying and the removing are repeated until the second region (described above) of the lanthanum-family-based oxide layer is entirely removed. In accordance with another additional embodiment of the present invention, subsequent to removing the lanthanum-family-based halide portion with the water vapor treatment, the substrate is exposed to a water-based solution including hydrochloric acid (HCl).

Figure 3:
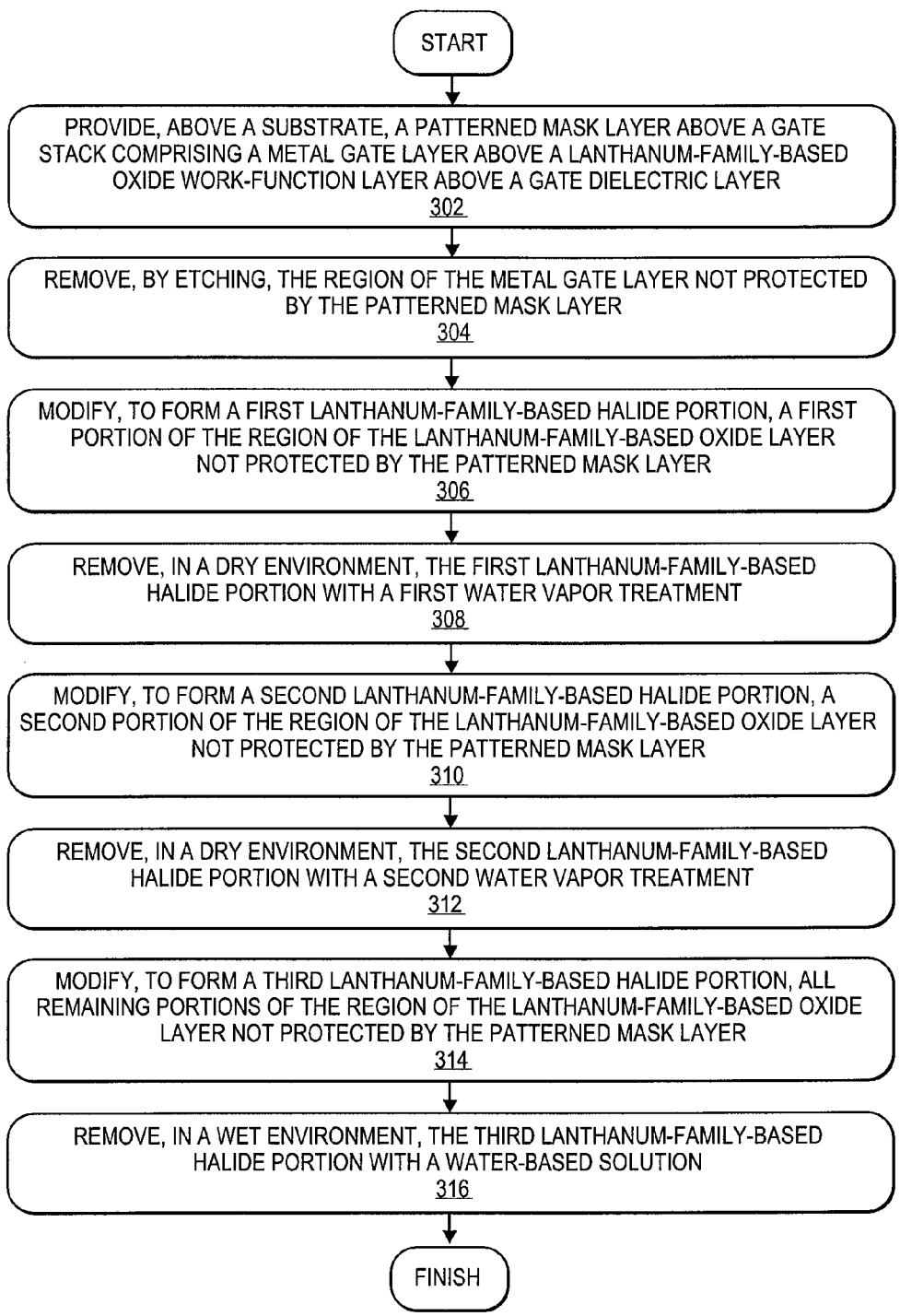
FIG. 3 depicts a Flowchart representing a series of operations in a method for fabricating a semiconductor device having a lanthanum-family-based oxide layer, in accordance with an embodiment of the present invention.

In another aspect of the present invention, methods for fabricating a semiconductor device having a lanthanum-family-based oxide layer include the use of multiple water vapor treatments. FIG. 3 depicts a Flowchart representing a series of operations in a method for fabricating a semiconductor device having a lanthanum-family-based oxide layer, in accordance with an embodiment of the present invention. FIGS. 4A-4G illustrate cross-sectional views representing operations in a method for fabricating a semiconductor device having a lanthanum-family-based oxide layer, corresponding to the operations of Flowchart 300, in accordance with an embodiment of the present invention.

Figure 4A:
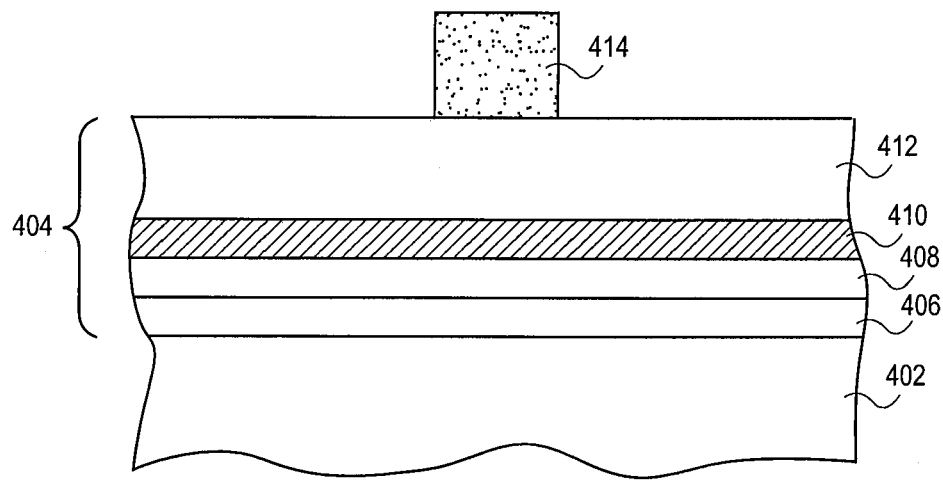
FIGS. 4A-4G illustrate cross-sectional views representing operations in a method for fabricating a semiconductor device having a lanthanum-family-based oxide layer, corresponding to the operations of the Flowchart of FIG. 3, in accordance with an embodiment of the present invention.

Referring to operation 302 of Flowchart 300 and corresponding FIG. 4A, a method for fabricating a semiconductor device includes providing, above a substrate 402, a patterned mask layer 414 above a gate stack 404. In accordance with an embodiment of the present invention, gate stack 404 includes a metal gate layer 410 above a lanthanum-family-based oxide work-function layer 408 above a gate dielectric layer 406. In an embodiment, gate stack 404 further includes a gate extension layer 412, as depicted in FIG. 4A.

Substrate 402 may be composed of a material suitable for semiconductor device fabrication. In one embodiment, substrate 402 is a bulk substrate composed of a single crystal of a material which may include, but is not limited to, silicon, germanium, silicon-germanium or a III-V compound semiconductor material. In another embodiment, substrate 402 includes a bulk layer with a top epitaxial layer. In a specific embodiment, the bulk layer is composed of a single crystal of a material which may include, but is not limited to, silicon, germanium, silicon-germanium, a III-V compound semiconductor material and quartz, while the top epitaxial layer is composed of a single crystal layer which may include, but is not limited to, silicon, germanium, silicon-germanium and a III-V compound semiconductor material. In another embodiment, substrate 402 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium and a III-V compound semiconductor material. The insulator layer is composed of a material which may include, but is not limited to, silicon dioxide, silicon nitride and silicon oxy-nitride. The lower bulk layer is composed of a single crystal which may include, but is not limited to, silicon, germanium, silicon-germanium, a III-V compound semiconductor material and quartz. Substrate 402 may further include dopant impurity atoms.

Gate dielectric layer 406 may be composed of a material suitable to electrically isolate a gate electrode from substrate 402. In one embodiment, gate dielectric layer 406 is formed by a thermal oxidation process or a chemical vapor deposition process and is composed of a material such as, but not limited to, silicon dioxide or silicon oxy-nitride and has a thickness approximately in the range of 1-5 nanometers. In another embodiment, gate dielectric layer 406 is formed by atomic layer deposition and is composed of a high-K dielectric material such as, but not limited to, hafnium oxide, zirconium oxide, hafnium silicate, hafnium oxy-nitride or lanthanum oxide and has a thickness approximately in the range of 1-10 nanometers. In a specific embodiment, a thin chemical oxide, such as silicon dioxide or silicon oxy-nitride, is formed between substrate 402 and the high-K dielectric material. The incorporation of a thin chemical oxide may lead to improved channel mobility.

Lanthanum-family-based oxide work-function layer 408 may be any layer of an oxide of a lanthanum-family element, e.g., selected from the lanthanum series (elements 57 through 71) of the Periodic Table of the Elements. For example, in an embodiment, lanthanum-family-based oxide layer 408 is a layer such as, but not limited to, a lanthanum oxide layer ($La_2O_3$), a lanthanum sub-oxide layer ($LaO_x$, where x is less than 1.5), cerium$^{IV}$ oxide ($CeO_2$) or cerium$^{III}$ oxide ($Ce_2O_3$). In one embodiment, lanthanum-family-based oxide layer 408 is included as a work-function-setting or work-function-altering layer in a gate stack. For example, in a specific embodiment, lanthanum-family-based oxide layer 408 alters the work-function of a gate stack by at least 0.05 eV from the work-function of a gate stack that otherwise excludes the lanthanum-family-based oxide layer. In an embodiment, lanthanum-family-based oxide layer 408 has a thickness approximately in the range of 0.5 nanometers-5 nanometers.

Metal gate layer 410 may be composed of a material suitable for use as an electrode in a semiconductor device. In accordance with an embodiment of the present invention, metal gate layer 410 is composed of a material such as, but not limited to a metal nitride, a metal carbide, hafnium, zirconium, titanium, tantalum, aluminum, ruthenium, palladium, platinum, cobalt, nickel, a conductive metal oxide, and a combination thereof. In a specific embodiment, metal gate layer 410 is composed of a layer of titanium nitride having a thickness approximately in the range of 5 nanometers-40 nanometers.

Gate extension layer 412 may be composed of a material suitable for patterning and for maintaining an appropriate aspect ratio in a subtractive gate integration scheme. In one embodiment, gate extension layer 412 is composed of a semiconductor material such as, but not limited to, poly-crystalline silicon, doped poly-crystalline silicon, amorphous silicon, doped amorphous silicon or a silicon-germanium alloy. In another embodiment, gate extension layer 412 is composed of an insulating material such as, but not limited to, silicon dioxide, silicon oxy-nitride or silicon nitride. However, in an embodiment, gate extension layer 412 is conductive and ultimately a contact to gate stack 404 is made through gate extension layer 412.

Patterned mask layer 414 may be composed of a material suitable for use in a lithographic process, e.g. a photo-resist layer. That is, in one embodiment, patterned mask layer 414 is formed upon exposure of a blanket film of photo-resist to a light source and subsequent development of the exposed photo-resist. In an embodiment, patterned mask layer 414 is composed of a positive photo-resist material. In a specific embodiment, patterned mask layer 414 is composed of a positive photo-resist material such as, but not limited to, a 248 nm resist, a 193 nm resist, a 157 nm resist, an extreme ultra-violet (EUV) resist or a phenolic resin matrix with a diazonaphthoquinone sensitizer. In another embodiment, patterned mask layer 414 is composed of a negative photo-resist material. In a specific embodiment, patterned mask layer 414 is composed of a negative photo-resist material such as, but not limited to, poly-cis-isoprene or poly-vinyl-cinnamate. In accordance with another embodiment of the present invention, patterned mask layer 414 is also, or alternatively, composed of a hard-mask material such as, but not limited to, silicon oxide or silicon nitride. In yet another embodiment, patterned mask layer 414 is composed substantially of carbon atoms. In one embodiment, patterned mask layer 414 consists essentially of a mixture of $sp^3$ (diamond-like)-, $sp^2$ (graphitic)- and $sp^1$ (pyrolitic)-hybridized carbon atoms formed from a chemical vapor deposition process using hydrocarbon precursor molecules. Such a film is known in the art as an amorphous carbon film, an example of which is the Advanced Patterning Film™ (APF™) from Applied Materials.

Figure 4B:
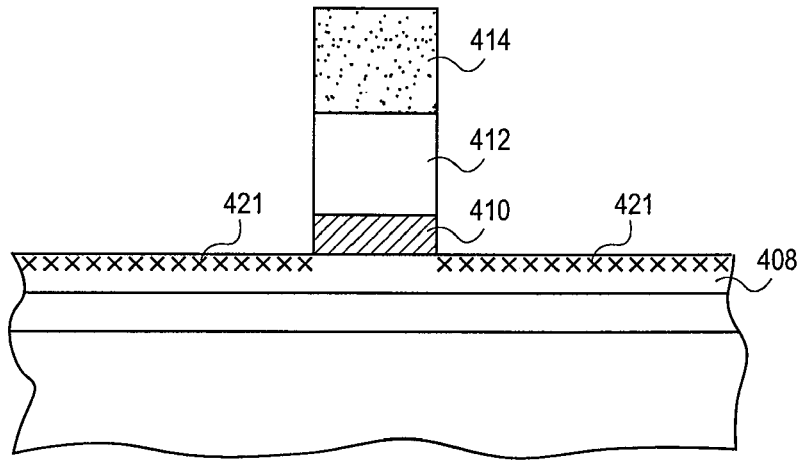

Referring to operation 304 of Flowchart 300 and corresponding FIG. 4B, the region of metal gate layer 410 not protected by patterned mask layer 414 is removed by etching. In accordance with an embodiment of the present invention, the region of metal gate layer 410 not protected by patterned mask layer 414 is removed by etching using an anisotropic dry etching process. In one embodiment, gate extension layer 412 is patterned in the same operation as the removal of the region of metal gate layer 410 not protected by patterned mask layer 414, as depicted in the transition from FIG. 4A to FIG. 4B. In an alternative embodiment, gate extension layer 412 is patterned in a separate operation, previous to the removal of the region of metal gate layer 410 not protected by patterned mask layer 414.

Referring to operation 306 of Flowchart 300 and again to corresponding FIG. 4B, a first portion of the region of lanthanum-family-based oxide layer 408 not protected by patterned mask layer 414 is modified to form a first lanthanum-family-based halide portion 421. In accordance with an embodiment of the present invention, the first portion of the region of lanthanum-family-based oxide layer 408 not protected by patterned mask layer 414 is modified in the same process operation used to remove the region of metal gate layer 410 not protected by patterned mask layer 414, as described above. In one embodiment, the first portion of the region of lanthanum-family-based oxide layer 408 not protected by patterned mask layer 414 is modified by treating with a plasma formed from species selected from the group consisting of HCl, $Cl_2$, HBr, and $Br_2$. In an embodiment, forming first lanthanum-family-based halide portion 421 includes forming a portion such as, but not limited to, a lanthanum-family-based fluoride portion, a lanthanum-family-based chloride portion, or lanthanum-family-based bromide portion. In one embodiment, forming first lanthanum-family-based halide portion 421 includes forming a lanthanum halide portion. In an embodiment, modifying the first portion of lanthanum-family-based oxide layer 408 is performed in the same process chamber as, and immediately following, the etching of the portion of metal gate layer 410. In one embodiment, substrate 402 is biased with an $R_F$ bias approximately in the range between 0-100 Watts during the modifying. In a specific embodiment, the biasing enables break-through, with halide species, of the top surface of the first portion of the region of lanthanum-family-based oxide layer 408 not protected by patterned mask layer 414. In an alternative embodiment, modification operation 306 is omitted prior to performing the first water vapor treatment described in association with operation 308, below.

Figure 4C:
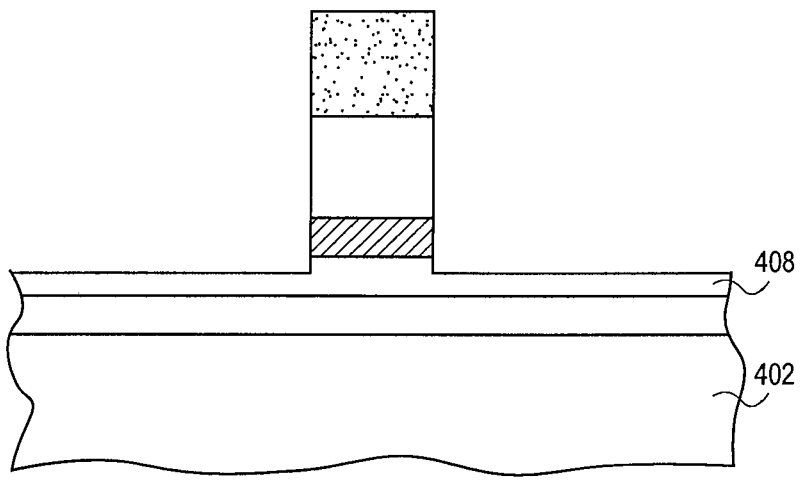

Referring to operation 308 of Flowchart 300 and to corresponding FIG. 4C, in a dry environment, first lanthanum-family-based halide portion 421 is removed with a first water vapor treatment. In accordance with an embodiment of the present invention, removing first lanthanum-family-based halide portion 421 with the first water vapor treatment includes using a combination of water vapor and a vapor such as, but not limited to, $Cl_2$ or HCl vapor. In one embodiment, removing lanthanum-family-based halide portion 421 with the water vapor treatment includes using a combination of water vapor HCl gas. In a specific embodiment, the combination of water vapor HCl gas is used in a plasma environment. In another specific embodiment, the combination of water vapor HCl gas is used in a non-plasma environment and, subsequently, in a plasma environment. In yet another specific embodiment, the combination of water vapor HCl gas is used in a non-plasma environment and, subsequently, in a plasma environment and, subsequently, a purge gas is used in a plasma environment to remove any water stains. In one embodiment, the water vapor and the $Cl_2$ or HCl vapor are alternately introduced and removed from a process chamber for at least one iteration in order to mitigate acid build-up on the walls of the chamber. In accordance with an alternative embodiment of the present invention, removing first lanthanum-family-based halide portion 421 with the first water vapor treatment includes using water vapor only.

In an embodiment, removing first lanthanum-family-based halide portion 421 with the first water vapor treatment includes placing substrate 402 in a chamber having aluminum walls and introducing water vapor into the chamber at a pressure approximately in the range of 100 mTorr-5 Torr while heating substrate 402 at a temperature approximately in the range of 80-300 degrees Celsius. In one embodiment, heating substrate 402 includes ramping, over the duration of the first water vapor treatment, the temperature of substrate 402 from a temperature of approximately 80 degrees Celsius to a final temperature approximately in the range of 150-300 degrees Celsius.

Figure 4D:
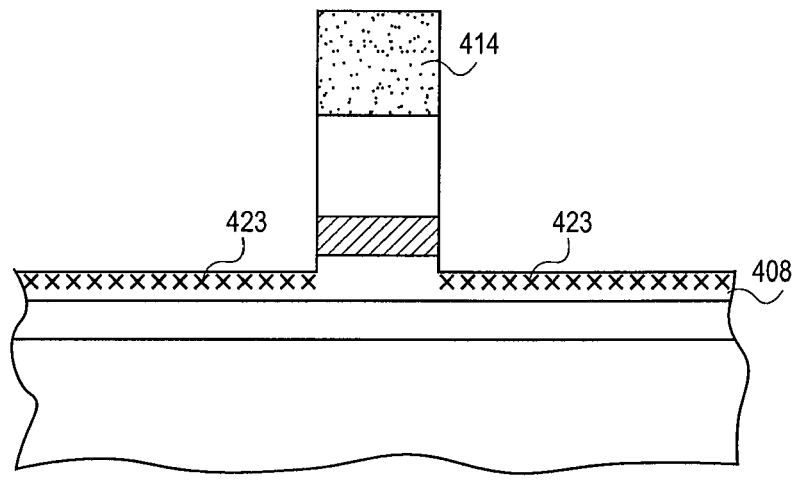

Referring to operation 310 of Flowchart 300 and to corresponding FIG. 4D, a second portion of the region of lanthanum-family-based oxide layer 408 not protected by patterned mask layer 414 is modified to form a second lanthanum-family-based halide portion 423. In accordance with an embodiment of the present invention, second portion of the region of lanthanum-family-based oxide layer 408 not protected by patterned mask layer 414 is modified by treating with a plasma formed from species such as, but not limited to HCl, $Cl_2$, HBr, and $Br_2$. In another embodiment, the plasma is formed from $BCl_3$. In an embodiment, forming second lanthanum-family-based halide portion 423 includes forming a portion such as, but not limited to, a lanthanum-family-based fluoride portion, a lanthanum-family-based chloride portion, or lanthanum-family-based bromide portion. In one embodiment, forming second lanthanum-family-based halide portion 423 includes forming a lanthanum halide portion. In an alternative embodiment, modification operation 310 is omitted prior to performing the second water vapor treatment described in association with operation 312, below.

Figure 4E:
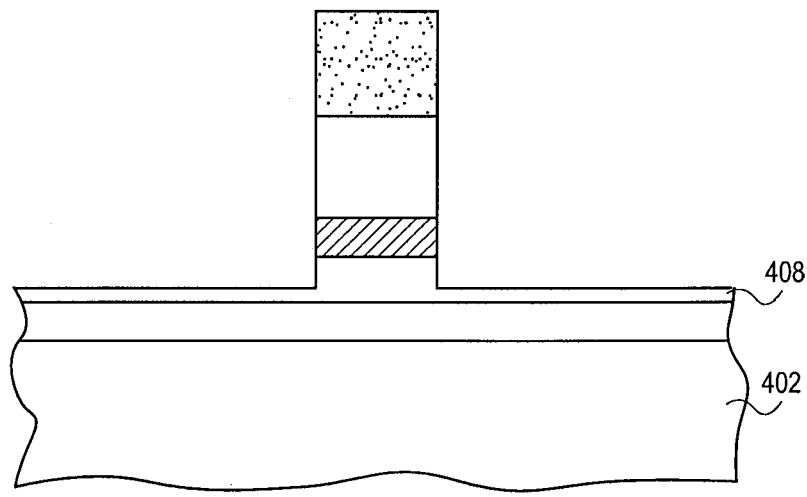

Referring to operation 312 of Flowchart 300 and to corresponding FIG. 4E, in a dry environment, second lanthanum-family-based halide portion 423 is removed with a second water vapor treatment. In accordance with an embodiment of the present invention, removing second lanthanum-family-based halide portion 423 with the second water vapor treatment includes using a combination of water vapor and a vapor such as, but not limited to, $Cl_2$ or HCl vapor. In one embodiment, removing lanthanum-family-based halide portion 423 with the water vapor treatment includes using a combination of water vapor HCl gas. In a specific embodiment, the combination of water vapor HCl gas is used in a plasma environment. In another specific embodiment, the combination of water vapor HCl gas is used in a non-plasma environment and, subsequently, in a plasma environment. In yet another specific embodiment, the combination of water vapor HCl gas is used in a non-plasma environment and, subsequently, in a plasma environment and, subsequently, a purge gas is used in a plasma environment to remove any water stains. In one embodiment, the water vapor and the $Cl_2$ or HCl vapor are alternately introduced and removed from a process chamber for at least one iteration in order to mitigate acid build-up on the walls of the chamber. In accordance with an alternative embodiment of the present invention, removing second lanthanum-family-based halide portion 423 with the second water vapor treatment includes using water vapor only.

In an embodiment, removing second lanthanum-family-based halide portion 423 with the second water vapor treatment includes placing substrate 402 in a chamber having aluminum walls and introducing water vapor into the chamber at a pressure approximately in the range of 100 mTorr-5 Torr while heating substrate 402 at a temperature approximately in the range of 80-300 degrees Celsius. In one embodiment, heating substrate 402 includes ramping, over the duration of the second water vapor treatment, the temperature of substrate 402 from a temperature of approximately 80 degrees Celsius to a final temperature approximately in the range of 150-300 degrees Celsius.

Figure 4F:
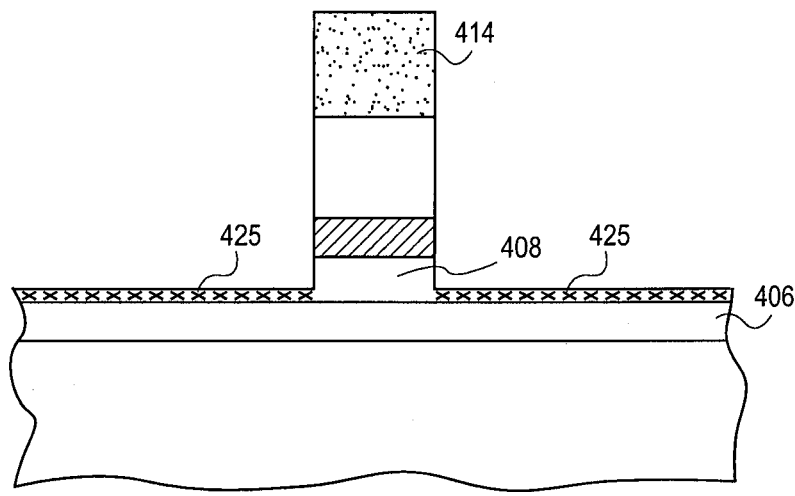

Referring to operation 314 of Flowchart 300 and to corresponding FIG. 4F, all remaining portions of the region of lanthanum-family-based oxide layer 408 not protected by patterned mask layer 414 are modified to form a third lanthanum-family-based halide portion 425. In accordance with an embodiment of the present invention, the all remaining portions of the region of lanthanum-family-based oxide layer 408 not protected by patterned mask layer 414 are modified by treating with a plasma formed from species such as, but not limited to, HCl, $Cl_2$, HBr, and $Br_2$. In another embodiment, the plasma is formed from $BCl_3$. In an embodiment, forming third lanthanum-family-based halide portion 425 includes forming a portion such as, but not limited to, a lanthanum-family-based fluoride portion, a lanthanum-family-based chloride portion, or lanthanum-family-based bromide portion. In one embodiment, forming third lanthanum-family-based halide portion 425 includes forming a lanthanum halide portion. In accordance with an embodiment of the present invention, the removing the portion of metal gate layer 410, the modifying of the first portion of lanthanum-family-based oxide layer 408, the removing of first lanthanum-family-based halide portion 421, the modifying of the second portion of lanthanum-family-based oxide layer 408, the removing of second lanthanum-family-based halide portion 423, and the modifying of all remaining portions of lanthanum-family-based oxide layer 408 are performed in a single-pass, without breaking vacuum, of substrate 402 in a single-wafer tool. In an embodiment, halide species are also incorporated into gate dielectric layer 406 during the formation of third lanthanum-family-based halide portion 425. In an alternative embodiment, modification operation 314 is omitted prior to performing the water-based solution treatment described in association with operation 316, below.

Figure 4G:
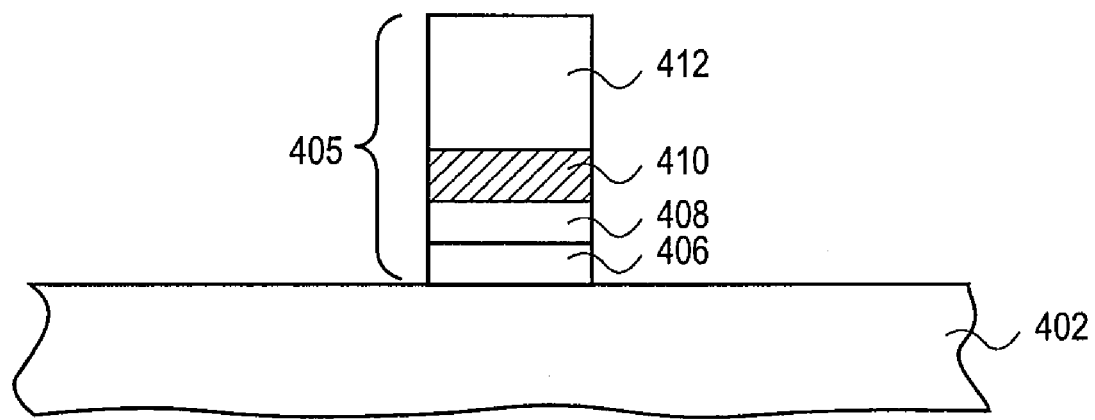

Referring to operation 316 of Flowchart 300 and to corresponding FIG. 4G, in a wet environment, third lanthanum-family-based halide portion 425 is removed with a water-based solution. In accordance with an embodiment of the present invention, removing third lanthanum-family-based halide portion 425 with the water-based solution includes using a water-based solution having hydrochloric acid (HCl) with a water to HCl weight ratio approximately in the range of 5:1 to 50:1. In one embodiment, the water-based solution is applied for a duration approximately in the range of 1-5 minutes. In an embodiment, upon applying the water-based solution, patterned gate stack 405 is provided. In an embodiment, as depicted in FIG. 4G, gate dielectric layer 406 is also patterned either during the water-based solution treatment operation 316 or in a separate, subsequent, operation. Furthermore, in an embodiment, patterned mask layer 414 is removed, as is also depicted in FIG. 4G.

Subsequent to the formation of the structure described in association with FIG. 4G, source and drain regions may be formed by implanting dopant impurity atoms into substrate 402, on either side of patterned gate stack 405. The source and drain regions may be regions having the opposite conductivity to a channel region directly beneath patterned gate stack 405. For example, in accordance with an embodiment of the present invention, the channel region is a P-type doped region and the source and drain regions are N-type doped regions. In one embodiment, the source and drain regions are composed of phosphorous or arsenic dopant impurity atoms with a concentration in the range of $5\times10^{16}-5\times10^{19}$ atoms/$cm^3$. In accordance with another embodiment of the present invention, the channel region is an N-type doped region and the source and drain regions are P-type doped regions. In one embodiment, the source and drain regions are composed of boron dopant impurity atoms with a concentration in the range of $5\times10^{16}-5\times10^{19}$ atoms/$cm^3$.

A semiconductor device fabricated by operations described in association with FIGS. 4A-4G may be a semiconductor device compatible with a subtractive metal gate integration scheme. For example, in accordance with an embodiment of the present invention, the semiconductor device is a device such as, but not limited to, a planar MOS-FET, a memory transistor or a Microelectromechanical System (MEMS). In one embodiment, the semiconductor device is a planar MOS-FET and is an isolated device or is one device in a plurality of nested devices. As will be appreciated for the typical integrated circuit, both N- and P-type transistors may be fabricated on a single substrate to form a CMOS integrated circuit.

Thus, methods for fabricating a semiconductor device having a lanthanum-family-based oxide layer have been disclosed. In accordance with an embodiment of the present invention, a gate stack having a lanthanum-family-based oxide layer is provided above a substrate. At least a portion of the lanthanum-family-based oxide layer is modified to form a lanthanum-family-based halide portion. The lanthanum-family-based halide portion is removed with a water vapor treatment. In accordance with another embodiment of the present invention, a patterned mask layer is provided above a gate stack, the gate stack including a metal gate layer above a lanthanum-family-based oxide work-function layer above a gate dielectric layer. The region of the metal gate layer not protected by the patterned mask layer is removed by etching. A first portion of the region of the lanthanum-family-based oxide layer not protected by the patterned mask layer is modified to form a first lanthanum-family-based halide portion. The first lanthanum-family-based halide portion is removed, in a dry environment, with a first water vapor treatment. A second portion of the region of the lanthanum-family-based oxide layer not protected by the patterned mask layer is modified to form a second lanthanum-family-based halide portion. The second lanthanum-family-based halide portion is removed, in a dry environment, with a second water vapor treatment. All remaining portions of the region of the lanthanum-family-based oxide layer not protected by the patterned mask layer are modified to form a third lanthanum-family-based halide portion. The third lanthanum-family-based halide portion is then removed, in a wet environment, with a water-based solution.

What is claimed is:

1. A method for fabricating a semiconductor device, comprising:
    providing, above a substrate, a gate stack having a lanthanum-family-based oxide layer, wherein the gate stack includes a patterned mask layer above a first region, but not above a second region, of the lanthanum-family-based oxide layer;
    modifying the second region of the lanthanum-family-based oxide layer to form a lanthanum-family-based halide portion;
    removing the lanthanum-family-based halide portion with a water vapor treatment; and
    repeating the modifying and the removing until the second region of the lanthanum-family-based oxide layer is entirely removed.

2. The method of claim 1, wherein modifying the second region of the lanthanum-family-based oxide layer comprises treating the second region with a plasma formed from species selected from the group consisting of HCl, $Cl_2$, HBr, and $Br_2$.

3. The method of claim 1, wherein forming the lanthanum-family-based halide portion comprises forming a portion selected from the group consisting of a lanthanum-family-based fluoride portion, a lanthanum-family-based chloride portion, and lanthanum-family-based bromide portion.

4. The method of claim 3, wherein forming the lanthanum-family-based halide portion comprises forming a lanthanum halide portion.

5. The method of claim 1, wherein removing the lanthanum-family-based halide portion with the water vapor treatment consists essentially of using water vapor.

6. A method for fabricating a semiconductor device, comprising:
    providing, above a substrate, a gate stack having a lanthanum-family-based oxide layer;
    modifying at least a portion of the lanthanum-family-based oxide layer to form a lanthanum-family-based halide portion; and
    removing the lanthanum-family-based halide portion with a water vapor treatment comprising using a combination of water vapor and a vapor selected from the group consisting of $Cl_2$ and HCl vapor.

7. A method for fabricating a semiconductor device, comprising:
    providing, above a substrate, a gate stack having a lanthanum-family-based oxide layer;
    modifying at least a portion of the lanthanum-family-based oxide layer to form a lanthanum-family-based halide portion; and
    removing the lanthanum-family-based halide portion with a water vapor treatment comprising placing the substrate in a chamber having aluminum walls and introducing water vapor into the chamber at a pressure approximately in the range of 100 mTorr-5 Torr while heating the substrate at a temperature approximately in the range of 80-300 degrees Celsius.

8. The method of claim 7, further comprising:
    subsequent to removing the lanthanum-family-based halide portion with the water vapor treatment, exposing the substrate to a water-based solution comprising hydrochloric acid (HCl).

9. The method of claim 7, wherein heating the substrate comprises ramping, over the duration of the water vapor treatment, the temperature of the substrate from a temperature of approximately 80 degrees Celsius to a final temperature approximately in the range of 150-300 degrees Celsius.

10. The method of claim 7, wherein forming the lanthanum-family-based halide portion comprises forming a portion selected from the group consisting of a lanthanum-family-based fluoride portion, a lanthanum-family-based chloride portion, and lanthanum-family-based bromide portion.

11. A method for fabricating a semiconductor device, comprising:
    providing, above a substrate, a patterned mask layer above a gate stack, the gate stack comprising a metal gate layer above a lanthanum-family-based oxide work-function layer above a gate dielectric layer;
    removing, by etching, a region of the metal gate layer not protected by the patterned mask layer;
    modifying, to form a first lanthanum-family-based halide portion, a first portion of the region of the lanthanum-family-based oxide layer not protected by the patterned mask layer;
    removing, in a dry environment, the first lanthanum-family-based halide portion with a first water vapor treatment;
    modifying, to form a second lanthanum-family-based halide portion, a second portion of the region of the lanthanum-family-based oxide layer not protected by the patterned mask layer;
    removing, in a dry environment, the second lanthanum-family-based halide portion with a second water vapor treatment;
    modifying, to form a third lanthanum-family-based halide portion, all remaining portions of the region of the lanthanum-family-based oxide layer not protected by the patterned mask layer; and
    removing, in a wet environment, the third lanthanum-family-based halide portion with a water-based solution.

12. The method of claim 11, wherein modifying the first, the second, and all remaining portions of the lanthanum-family-based oxide layer comprises treating with a plasma formed from species selected from the group consisting of HCl, $Cl_2$, HBr, and $Br_2$.

13. The method of claim 11, wherein forming the first, the second, and the third lanthanum-family-based halide portions comprises forming portions selected from the group consisting of a lanthanum-family-based fluoride portion, a lanthanum-family-based chloride portion, and lanthanum-family-based bromide portion.

14. The method of claim 13, wherein forming the first, the second, and the third lanthanum-family-based halide portions comprises forming lanthanum halide portions.

15. The method of claim 11, wherein removing the first and the second lanthanum-family-based halide portions with the first and second water vapor treatments comprises using a combination of water vapor and a vapor selected from the group consisting of $Cl_2$ and HCl vapor.

16. The method of claim 11, wherein removing the first and the second lanthanum-family-based halide portions with the first and second water vapor treatments consists essentially of using water vapor.

17. The method of claim 11, wherein removing the first and the second lanthanum-family-based halide portions with the first and the second water vapor treatments comprises placing the substrate in a chamber having aluminum walls and introducing water vapor into the chamber at a pressure approximately in the range of 100 mTorr-5 Torr while heating the substrate at a temperature approximately in the range of 80-300 degrees Celsius.

18. The method of claim 17, wherein heating the substrate comprises ramping, over the duration of each of the first and the second water vapor treatments, the temperature of the substrate from a temperature of approximately 80 degrees Celsius to a final temperature approximately in the range of 150-300 degrees Celsius.

19. The method of claim 11, wherein modifying the first portion of the lanthanum-family-based oxide layer is performed in the same process chamber as, and immediately following, the etching of the portion of the metal gate layer, and wherein the substrate is biased with an $R_F$ bias approximately in the range between 0-100 Watts during the modifying.

20. The method of claim 11, wherein the removing of the portion of the metal gate layer, the modifying of the first portion of the lanthanum-family-based oxide layer, the removing of the first lanthanum-family-based halide portion, the modifying of the second portion of the lanthanum-family-based oxide layer, the removing of the second lanthanum-family-based halide portion, and the modifying all remaining portions of the lanthanum-family-based oxide layer are performed in a single-pass, without breaking vacuum, of the substrate in a single-wafer tool.

21. The method of claim 11, wherein removing the third lanthanum-family-based halide portion with the water-based solution comprises using a water-based solution having hydrochloric acid (HCl) with a water to HCl weight ratio approximately in the range of 5:1 to 50:1.

* * * * *